(12) United States Patent
Deng et al.

(10) Patent No.: US 9,212,668 B2
(45) Date of Patent: Dec. 15, 2015

(54) FAN DEVICE

(71) Applicant: ShenZhen Treasure City Technology Co., LTD., ShenZhen (CN)

(72) Inventors: Ping-Chuan Deng, Shenzhen (CN); An-Gang Liang, Shenzhen (CN); Zheng-Heng Sun, New Taipei (TW)

(73) Assignee: ShenZhen Treasure City Technology Co., LTD., ShenZhen (CN)

( * ) Notice: Subject to any disclaimer, the term of this patent is extended or adjusted under 35 U.S.C. 154(b) by 569 days.

(21) Appl. No.: 13/666,890

(22) Filed: Nov. 1, 2012

(65) Prior Publication Data
US 2014/0119911 A1  May 1, 2014

(30) Foreign Application Priority Data
Oct. 26, 2012 (CN) .......................... 2012 1 04153789

(51) Int. Cl.
*F04D 29/64* (2006.01)
*H05K 7/20* (2006.01)
*F04D 25/16* (2006.01)
*F04D 25/14* (2006.01)

(52) U.S. Cl.
CPC ............ *F04D 29/646* (2013.01); *F04D 25/166* (2013.01); *H05K 7/20172* (2013.01); *H05K 7/20736* (2013.01); *F04D 25/14* (2013.01)

(58) Field of Classification Search
CPC ... H05K 7/20172; F04D 19/002; F04D 25/12; F04D 25/14; F04D 25/166; F04D 29/4226; F04D 29/4253; F04D 29/56; F04D 29/646
See application file for complete search history.

(56) References Cited

U.S. PATENT DOCUMENTS

| | | | | |
|---|---|---|---|---|
| 2,456,340 A | * | 12/1948 | Tideman | 454/208 |
| 6,126,415 A | * | 10/2000 | Lasko | 417/423.15 |
| 6,158,140 A | * | 12/2000 | Orr | 34/62 |

* cited by examiner

*Primary Examiner* — Nathaniel Wiehe
*Assistant Examiner* — Michael Sehn
(74) *Attorney, Agent, or Firm* — Novak Druce Connolly Bove + Quigg LLP

(57) ABSTRACT

A fan device includes a board defining an opening and a fan assembly pivotably received in the opening. The fan assembly includes a fan and a frame receiving the fan. The frame includes a top wall, a bottom wall, and two sidewalls. A front plate extends down and diagonally forward from a front side of the bottom wall. A resilient limiting member is formed on one of the sidewalls. When a bottom of the fan assembly is pivoted rearward to make the fan assembly slanting relative to the board, the front plate is abutted a front side of the board, and the limiting member is abutted a rear side of the board.

7 Claims, 6 Drawing Sheets

FAN DEVICE

BACKGROUND

1. Technical Field

The present disclosure relates to a fan device.

2. Description of Related Art

Fan brackets are often installed to sides of server racks to dissipate heat generated by the servers. However, fans mounted to a fan bracket are often slanting relative to the fan bracket to allow for even airflow, and the slanted fans requires more space along one dimension. As a result, a server rack needs to be long enough to receive a whole fan bracket with the fans, otherwise parts of the slanted fans may stick out of the server rack and be broken easily in packaging and transportation, which is undesirable.

BRIEF DESCRIPTION OF THE DRAWINGS

Many aspects of the present embodiments can be better understood with reference to the following drawings. The components in the drawings are not necessarily drawn to scale, the emphasis instead being placed upon clearly illustrating the principles of the present embodiments. Moreover, in the drawings, all the views are schematic, and like reference numerals designate corresponding parts throughout the several views.

DETAILED DESCRIPTION

The disclosure, including the accompanying drawings, is illustrated by way of example and not by way of limitation. It should be noted that references to "an" or "one" embodiment in this disclosure are not necessarily to the same embodiment, and such references mean at least one.

Figure 1:
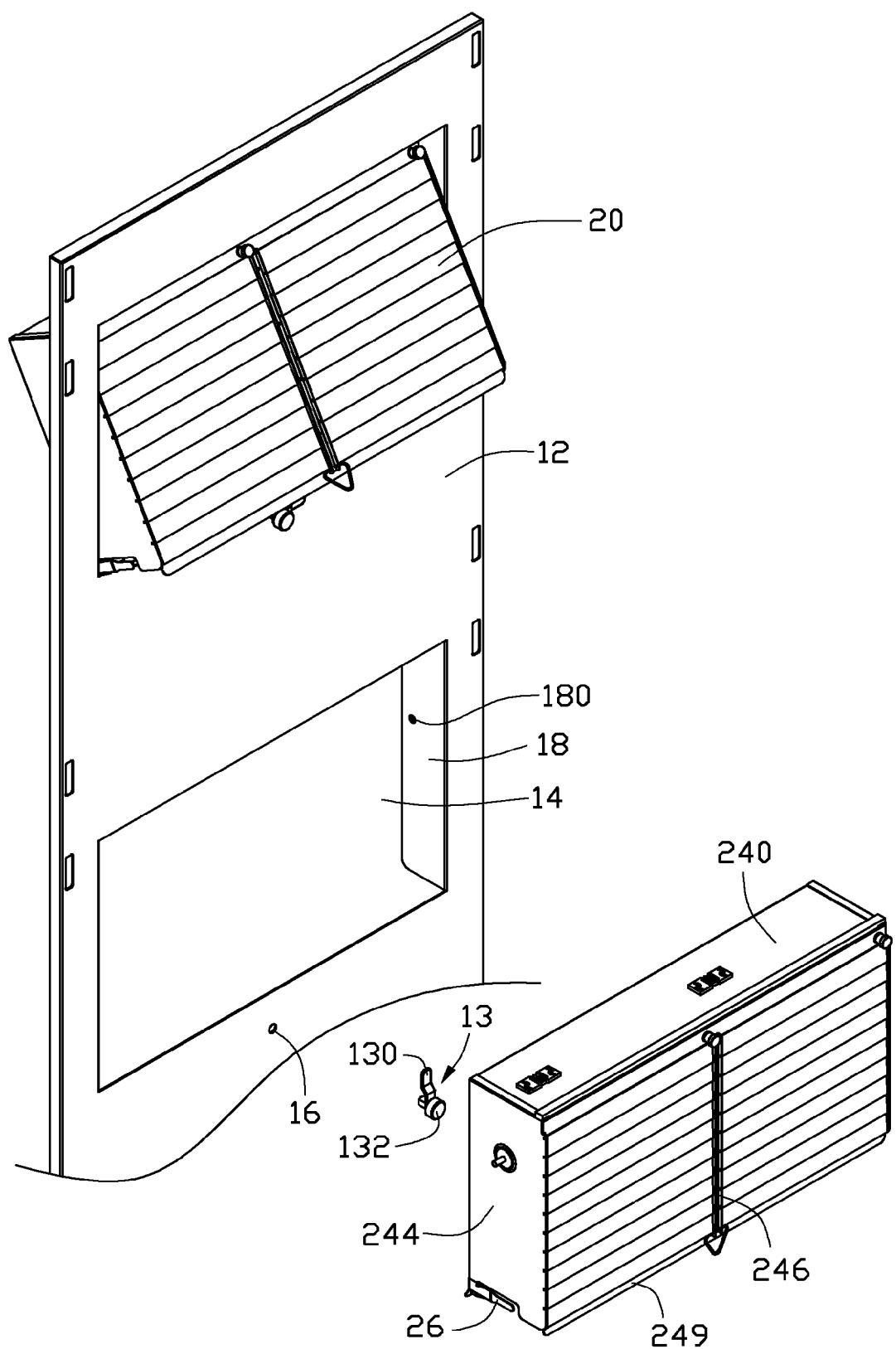
FIG. 1 is an exploded, isometric view of an exemplary embodiment of a fan device including a plurality of fan assemblies.
Figure 6:
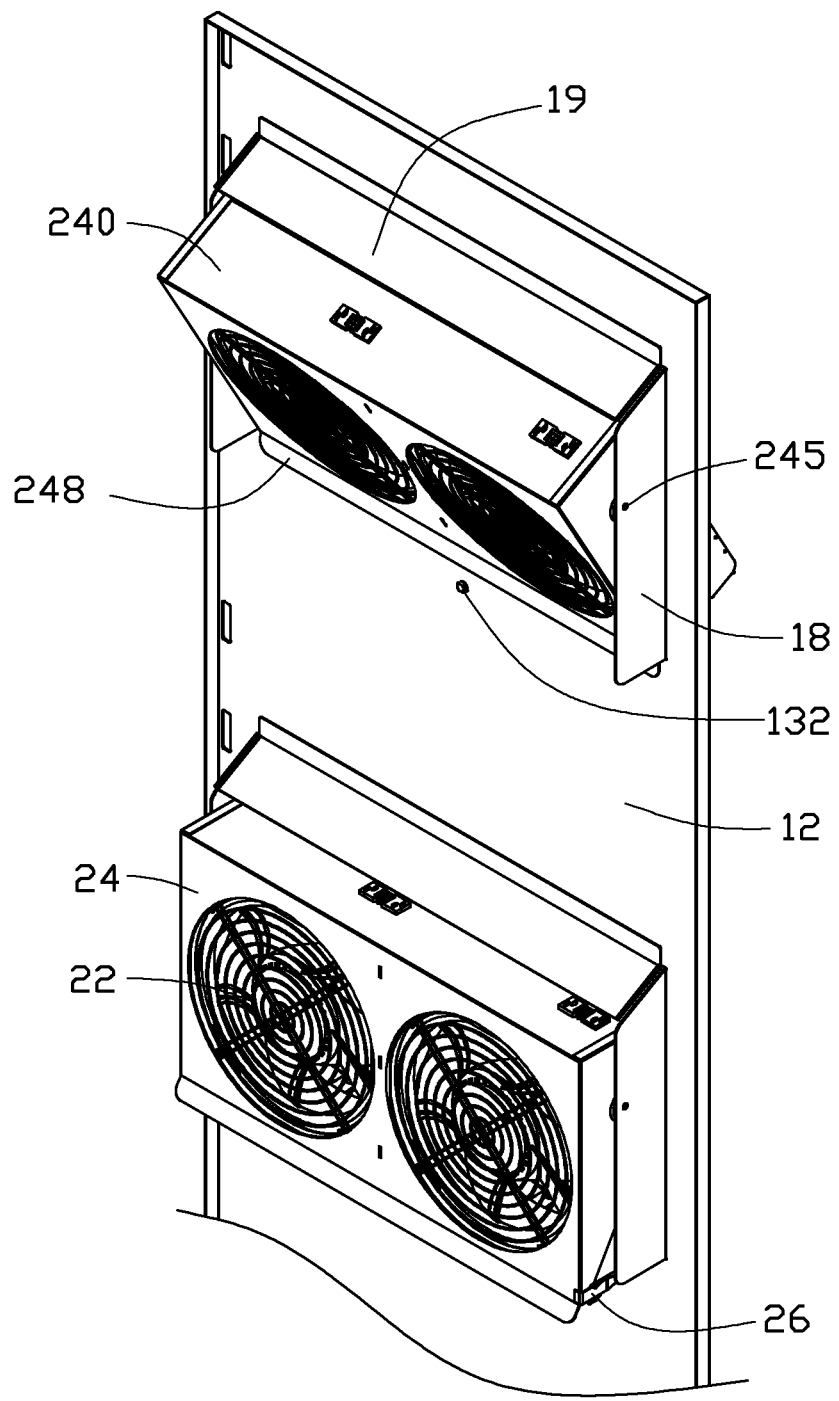
FIG. 6 is similar to FIG. 3, but viewed from another perspective.

FIGS. 1 and 6 show an exemplary embodiment of a fan device. The fan device includes a board 12, a plurality of fan assemblies 20, and a plurality of fixing members 13.

The board 12 defines a plurality of spaced openings 14 arranged in a lengthwise direction of the board 12. A fixing hole 16 is defined in the board 12, below each opening 14. Two installation pieces 18 each defining a through hole 180 perpendicularly extend forward from the board 12, at opposite sides of each opening 14. A cover 19 extends down and diagonally forward from the board 12, at a top side of each opening 14. Each installation piece 18 forms a slanted top end to contact a bottom of a corresponding one of opposite ends of the cover 19.

Each fixing member 13 includes a fastener 132 and a tab 130 rotatably fitted about the fastener 132. The fastener 132 is engaged in one of the fixing holes 16.

Each fan assembly 20 includes a frame 24 and a plurality of fans 22 received in the fans 22.

Figure 2:
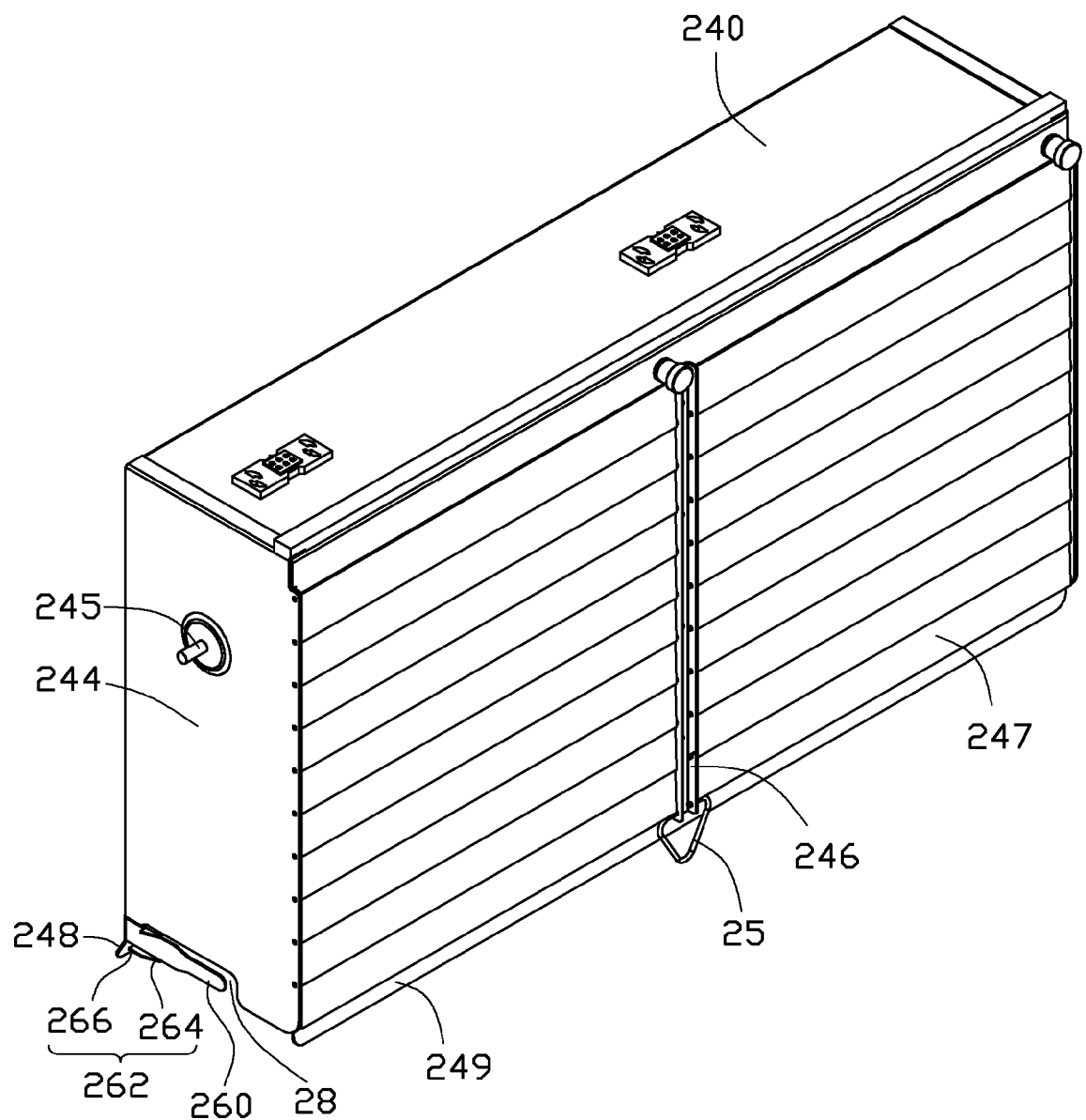
FIG. 2 is an enlarged view of one of the fan assemblies of FIG. 1.
Figure 3:
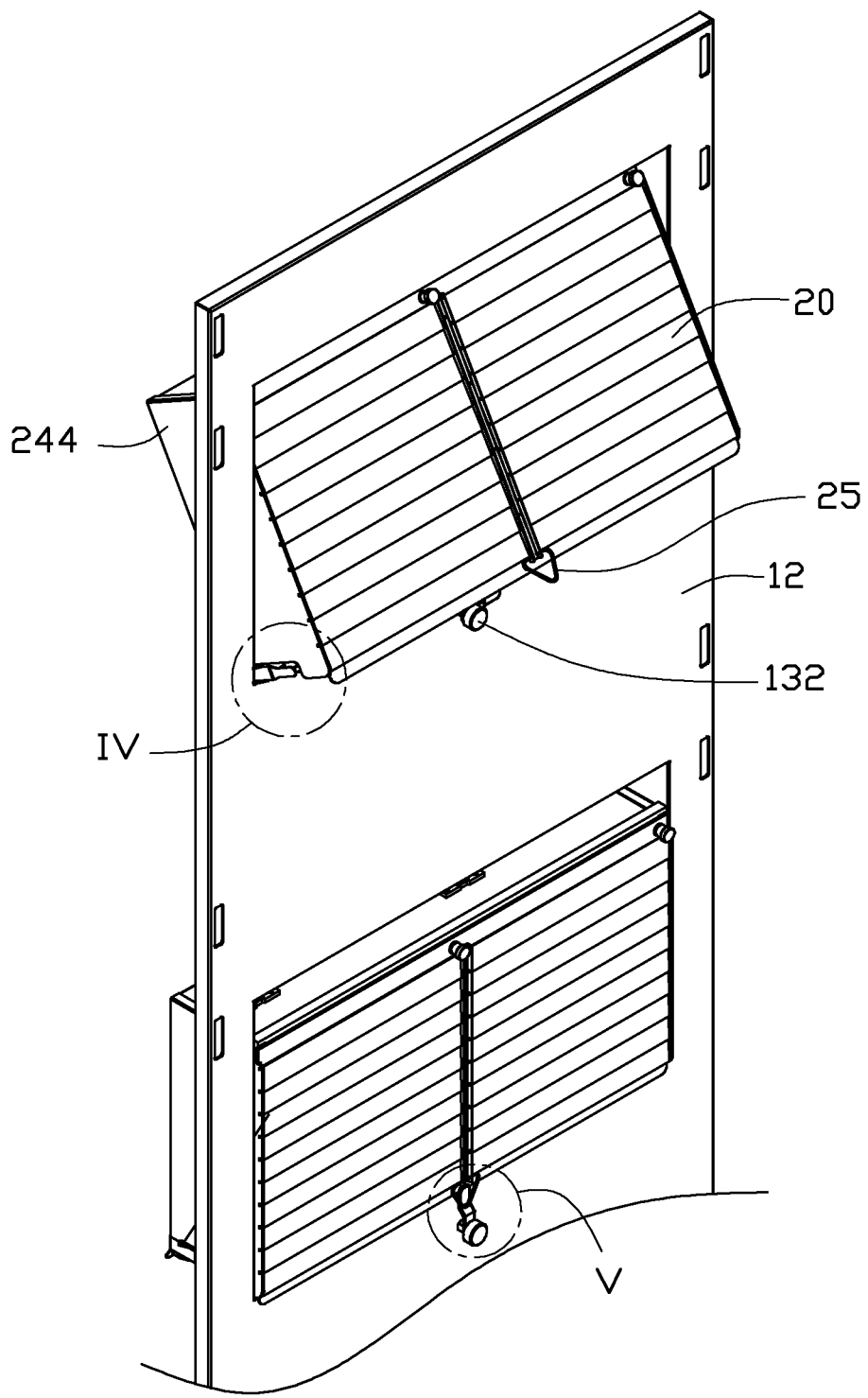
FIG. 3 is an assembled, isometric view of FIG. 1.
Figure 4:
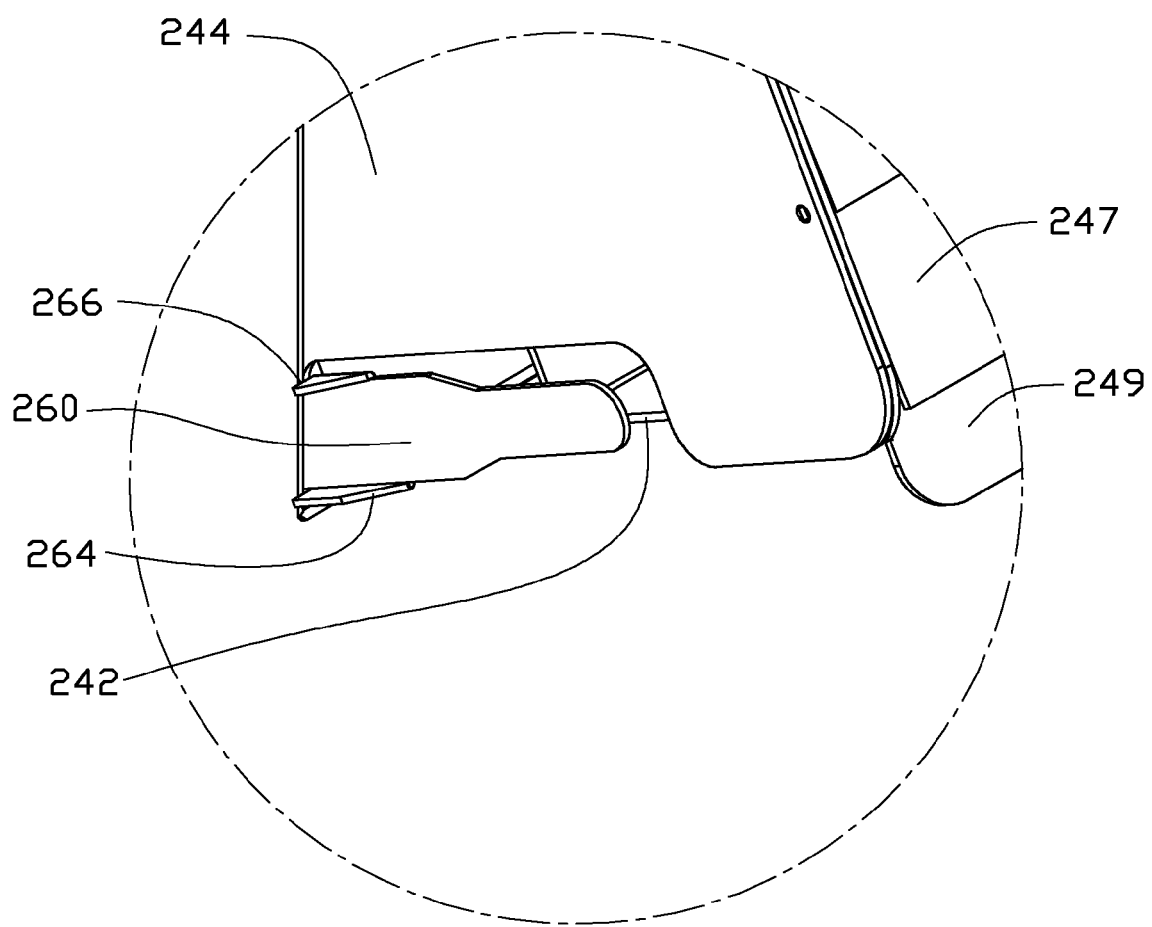
FIG. 4 is an enlarged view of the circled portion IV of FIG. 3.
Figure 5:
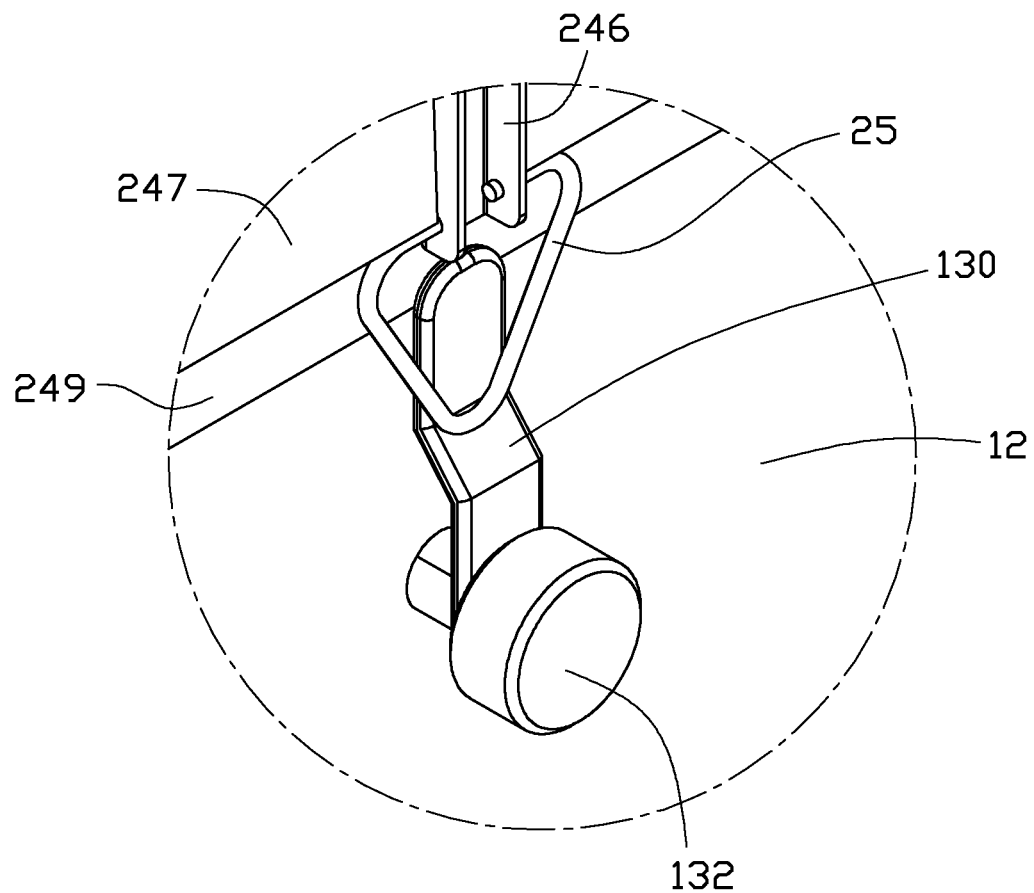
FIG. 5 is an enlarged view of the circled portion V of FIG. 3.

FIG. 2 shows the frame 24 of the embodiment. The frame 24 includes a top wall 240, a bottom wall 242 (shown in FIG. 4), and two sidewalls 244 connected between corresponding ends of the top and bottom walls 240 and 242. A plurality of shutter-shaped air guiding pieces 247 is pivotably connected between rear sides of the sidewalls 244. A bar 246 is connected between centers of the rear sides of the top and bottom walls 240 and 242, behind the air guiding pieces 247. A handle 25 is pivotably mounted to a bottom end of the bar 246. A front plate 248 slantingly extends down and forward from a front side of the bottom wall 242. A rear plate 249 extends down from the rear side of the bottom wall 242 opposite to the front plate 248. A pin 245 extends out from each sidewall 244, adjacent to a top end of the corresponding sidewall 244. A limiting member 26 is formed at a bottom end of each sidewall 244. A slot 28 is defined between each sidewall 244 and the corresponding limiting member 26. Therefore, the limiting member 26 is resilient. Each limiting member 26 includes a resilient piece 260 having a front end connected to the corresponding sidewall 244, and two projections 262 extending out from a top and a bottom side of the resilient piece 260. Each projection 262 includes a guiding surface 264 slantingly extending rearward and toward the corresponding resilient piece 260 from a side of the projection 262 opposite to the resilient piece 260, and a blocking surface 266 opposite to the guiding surface 264 and perpendicularly connected to the corresponding resilient piece 260.

Referring to FIGS. 3 to 6, in assembly, the pins 245 of each frame 24 are pivotably inserted into two opposite through holes 180, to pivotably mount the corresponding fan assembly 20 in the corresponding opening 14.

If keeping a fan assembly 20 positioned slantingly, the handle 25 is pulled up and rearward to move a bottom of the fan assembly up and rearward. The guiding surfaces 264 slide rearward along inner surfaces of the corresponding installation pieces 18 to deform the resilient pieces 260 toward each other, until the front plate 248 abuts the front surface of the board 12, and the blocking surfaces 266 abut the rear surface of the board 12. At this time, the top wall 240 contacts the corresponding cover 19. Thus, the fan assembly 20 is slanting relative to the board 12.

In vertically keeping one of the fan assemblies 20, the resilient pieces 260 are deformed toward each other to disengage the projections 262 from the board 12. The fan assembly 20 drops down under the gravitation, until the rear plate 249 abuts the rear surface of the board 12. The tab 130 is pivoted to block a rear surface of the rear plate 249, thereby keeping the fan assembly 20 in a vertical direction.

It is believed that the present embodiments and their advantages will be understood from the foregoing description, and various changes may be made thereto without departing from the spirit and scope of the description or sacrificing all of their material advantages, the examples hereinbefore described merely being exemplary embodiments.

What is claimed is:

1. A fan device, comprising:
   a board defining an opening; and
   a fan assembly comprising a frame pivotably mounted to the board and in the opening, and a fan received in the frame; the frame comprising a top wall, a bottom wall, and two sidewalls connected between corresponding ends of the top and bottom walls, a front plate extending down and diagonally forward from a front side of the bottom wall, a resilient limiting member formed on one of the sidewalls;
   wherein the front plate is abutted against a front surface of the board, and the limiting member is abutted against a rear surface of the board opposite to the front surface, in response to a bottom of the fan assembly is pivoted rearward to make the fan assembly slanting relative to the board.

2. The fan device of claim 1, wherein two installation pieces extend out from the front surface of the board at opposite sides of the opening, two pins extend out from the sidewalls of the frame to be pivotably inserted into the installation pieces.

3. The fan device of claim 2, wherein a cover slantingly extends down and forward from the board and at a top side of the opening, to contact the top wall of the frame in response to the fan assembly being slanting relative to the board.

4. The fan device of claim 1, wherein a rear plate extends down from a rear side of the bottom wall, a fixing member comprising a tab is mounted to a rear surface of the board adjacent to the opening, the rear plate is abutted the rear surface of the board, and the tab is abutted a rear surface of the rear plate, in response to the fan assembly being positioned in a direction in which the board extends.

5. The fan device of claim 4, wherein the fixing member further comprises a fastener extending through the tab and then engaged in the board, to pivotably mount the tab to the board.

6. The fan device of claim 1, wherein a slot is defined between the limiting member and the corresponding sidewall, the limiting member comprise a resilient piece having a front end connected to the sidewall and a projection extending out from the resilient piece, the projection comprises a slanted guiding surface slantingly extending rearward and a blocking surface opposite to the guiding surface to abut the rear surface of the board.

7. The fan device of claim 1, wherein a handle is mounted to a bottom of a rear side of the frame.

* * * * *